United States Patent
Fujita

(10) Patent No.: US 8,525,163 B2
(45) Date of Patent: Sep. 3, 2013

(54) ORGANIC EL DEVICE, METHOD FOR FABRICATING ORGANIC EL DEVICE, AND ORGANIC EL ILLUMINATION SYSTEM

(75) Inventor: Yoshimasa Fujita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/380,593

(22) PCT Filed: Apr. 6, 2010

(86) PCT No.: PCT/JP2010/002508
§ 371 (c)(1),
(2), (4) Date: Dec. 23, 2011

(87) PCT Pub. No.: WO2011/007480
PCT Pub. Date: Jan. 20, 2011

(65) Prior Publication Data
US 2012/0097939 A1    Apr. 26, 2012

(30) Foreign Application Priority Data
Jul. 17, 2009  (JP) ................. 2009-168572

(51) Int. Cl.
*H01L 29/08* (2006.01)
*H01L 35/24* (2006.01)
*H01L 51/00* (2006.01)

(52) U.S. Cl.
USPC ......... 257/40; 257/83; 257/84; 257/642; 257/759; 438/99; 438/623

(58) Field of Classification Search
USPC ........ 257/40, 59, 79, 80, 81, 82, 83, 84, 257/85, E51.013, 635, 642, 643, 759; 438/FOR. 135, 99, 623
See application file for complete search history.

(56) References Cited

U.S. PATENT DOCUMENTS
6,579,422 B1    6/2003  Kakinuma
2001/0024083 A1    9/2001  Yamazaki et al.
(Continued)

FOREIGN PATENT DOCUMENTS
JP    2001-345185 A    12/2001
JP    2004-247100 A    9/2004
(Continued)

OTHER PUBLICATIONS

International Search Report received for PCT Patent Application No. PCT/JP2010/002508, mailed on Jul. 13, 2010, 5 pages (2 pages of English translation and 3 pages of PCT search report).

*Primary Examiner* — Ha Tran T Nguyen
*Assistant Examiner* — Thanh Y Tran
(74) *Attorney, Agent, or Firm* — Morrison & Foerster LLP

(57) ABSTRACT

An organic EL device 1, for example, excellent in productivity and performance with reduced influence of a voltage drop can be provided at low fabrication cost. The organic EL device 1 includes band-shaped organic EL strips 3 arranged at spacings on a first substrate 2. Each of the organic EL strips 3 includes a second substrate 31, a negative electrode 32b, a positive electrode 32a, and an organic layer 33. The pair of the electrodes 32a and 32b and the organic layer 33 are stacked on the second substrate 2 with the organic layer 33 sandwiched between the electrodes 32a and 32b. The first substrate 2 includes a connection terminal electrode 5 and an auxiliary terminal electrode 6. For example, negative electrode 32b is electrically connected to the connection terminal electrode 5, and the positive electrode 32a is electrically connected to the auxiliary terminal electrode 6.

14 Claims, 9 Drawing Sheets

(56) References Cited

U.S. PATENT DOCUMENTS

| | | | |
|---|---|---|---|
| 2003/0006699 A1* | 1/2003 | Ogino et al. | 313/506 |
| 2004/0081836 A1* | 4/2004 | Inoue et al. | 428/469 |
| 2007/0263164 A1* | 11/2007 | Kumagai | 349/156 |
| 2010/0102713 A1* | 4/2010 | Seo et al. | 313/504 |

FOREIGN PATENT DOCUMENTS

| | | |
|---|---|---|
| JP | 2006-228557 A | 8/2006 |
| JP | 2008-21575 A | 1/2008 |
| JP | 2008-226598 A | 9/2008 |
| JP | 2008-257951 A | 10/2008 |
| WO | 01/05194 A1 | 1/2001 |

* cited by examiner

ORGANIC EL DEVICE, METHOD FOR FABRICATING ORGANIC EL DEVICE, AND ORGANIC EL ILLUMINATION SYSTEM

CROSS REFERENCE TO RELATED APPLICATIONS

This is a U.S. National Phase patent application of PCT/JP2010/002508, filed Apr. 6, 2010, which claims priority to Japanese Patent Application No. 2009-168572, filed Jul. 17, 2009, each of which is hereby incorporated by reference in the present disclosure in its entirety.

TECHNICAL FIELD

The present disclosure relates to organic electroluminescence (EL) devices, methods for fabricating organic EL devices, and organic EL illumination systems.

BACKGROUND ART

Incandescent lamps and fluorescent lamps have been used as recent mainstream illumination systems. The incandescent lamps utilize light emission obtained by current heating of tungsten filaments. The fluorescent lamps are a type of low-pressure discharge lamps enclosing mercury vapor, and utilize emission of visible light by phosphors due to an ultraviolet radiation spectrum of mercury excited by electrons.

An incandescent lamp has a low light-emission efficiency, and discharges a large amount of heat. For example, a gas-filled 100 W single-coil tungsten bulb has a light-emission efficiency of 14 lumens per watt (lm/W). An incandescent lamp can provide various types of projection illumination as a point light source, but generates a large amount of heat.

In contrast, a fluorescent lamp has a high light-emission efficiency, and can be a nearly ideal light source. For example, a general 20 W white fluorescent lamp has a light-emission efficiency of 40 to 60 lm/W and a high color-rendering index of 90 or more. In particular, a cold cathode fluorescent tube achieves a high luminance of 10,000 cd/m$^2$ or more in a narrow tube, and is widely used as a backlight for an LCD.

The fluorescent lamp, however, basically has a tubular shape because of the structure thereof, and thus, is disadvantageously limited in shape. In addition, because of the presence of mercury, the fluorescent lamp is not preferable in consideration of environmental issues.

For the reasons described above, the current mainstream illumination systems have disadvantages, and are not perfect. As other illumination systems, arc lamps and high-pressure mercury-vapor lamp are also used. These lamps including incandescent lamps and fluorescent lamps, however, are limited to the tube or bulb shapes, and are limited in size. In addition, most of these lamps are used for emitting white light.

Under these circumstances, demand for thin illumination systems has increased in recent years.

In view of this, the use of inorganic EL devices is expected. However, the inorganic EL devices have problems of requirement of high voltages, low light-emission efficiencies, and limited colors of emission, and actually have low possibilities of practical use.

On the other hand, organic EL devices have their performance significantly improved with research and development for application to displays, and are more and more expected to be practically used for illumination systems. The organic EL devices have advantages of easy dimming and being free from mercury.

At present, however, the organic EL devices are inferior to fluorescent lamps in terms of light-emission efficiency, color rendering properties, luminance, lifetime, and cost, for example. The light-emission efficiencies of the organic EL devices have been rapidly increased by active developments such as reduction of voltage with chemical doping techniques, increase in light-emission efficiency with the use of phosphorescent materials, and increase in lifetime with introduction of tandem constructions. However, in terms of cost, even in the case of application to illumination systems, since fabrication methods for such illumination systems are merely an extension of fabrication methods for displays, the cost thereof is greatly different from that for general illumination systems.

An organic EL device is fabricated through a large number of complicated processes such as stacking of a positive electrode, an organic layer, and a negative electrode, for example, patterned into predetermined shapes on a substrate. These processes tend to increase the fabrication cost. In addition, a large glass substrate is often employed as the substrate. This glass substrate is difficult to handle, and has a problem of a large initial investment.

As a solution to the problems described above, a roll-to-roll process is proposed (see Patent Document 1). In the roll-to-roll process, a film is deposited while a film substrate is wound from a roll to another roll, thereby significantly enhancing productivity.

However, in terms of performance, an organic EL device has problems, such as variation in light emission, degradation due to heating, and increase in power consumption, caused by a voltage drop.

Specifically, in the case of a current-driven method, as the distance from a power source to a light-emission point increases, the voltage decreases due to wiring resistance. Consequently, the applied voltage varies depending on the location of the light-emission point, causing a variation in light-emission, for example.

In particular, as the size of the organic EL device increases, the influence of a voltage drop increases. Thus, the solution to this problem is important. In addition, in the organic EL device, a conductive film transparent to visible light is often employed as an electrode for light extraction. This conductive film, however, has an electric resistance higher than that of a metal film, and thus, is easily affected especially by a voltage drop.

To reduce the influence of the voltage drop, a light-emission apparatus in which an auxiliary wire of a metal film is electrically connected to a conductive film in order to reduce the wiring resistance of a conductive film is proposed (see Patent Document 2).

CITATION LIST

Patent Documents

[Patent Document 1] International Patent Publication No. WO 01/05194
[Patent Document 2] Japanese Patent Publication No. 2001-345185

SUMMARY OF THE INVENTION

Technical Problem

In the roll-to-roll process of Patent Document 1, the substrate needs to have a high degree of a gas-barrier property in order to prevent degradation caused by moisture, for example, and thus, a cost increase tends to occur (see, for example, Japanese Patent Publication No. 2008-21575). In addition, in this process, a positive electrode and other components are patterned into predetermined shapes on the substrate, in the same manner as conventional fabrication methods. Thus, it is not easy to reduce the fabrication cost.

Likewise, in the light-emission apparatus of Patent Document 2, a positive electrode and other components including the auxiliary wire are patterned into predetermined shapes on a substrate. This configuration provides a high fabrication cost and complicated processes, and therefore, is disadvantageous in productivity.

It is therefore an object of the present disclosure to provide, for example, an organic EL device having high productivity and excellent performance with a reduced fabrication cost and a reduced influence of a voltage drop.

Solution to the Problem

An organic EL device according to the present disclosure includes: a first substrate; and a plurality of band-shaped organic EL strips arranged at spacings on the first substrate, wherein each of the organic EL strips includes a band-shaped second substrate, a pair of band-shaped electrodes of a negative electrode and a positive electrode, and a band-shaped organic layer configured to emit light upon application of a voltage, the pair of electrodes is provided on the second substrate with the organic layer sandwiched between the pair of electrodes, the first substrate includes a connection terminal electrode capable of being electrically connected to an external device, and an auxiliary terminal electrode electrically disconnected from the connection terminal electrode, one of the pair of electrodes is electrically connected to the connection terminal electrode, and the other of the pair of electrodes is electrically connected to the auxiliary terminal electrode.

In the organic EL device with the above configuration, the electrodes of each of the organic EL strips are connected to the connection terminal electrode and the auxiliary terminal electrode. The use of these terminal electrodes can reduce the influence of a voltage drop and enhance performance. Further, the organic EL strips including the second substrate and the organic layer are provided as different components from the first substrate forming the terminal electrodes, thereby allowing the organic EL strips to be formed with a roll-to-roll process, for example. As a result, fabrication processes can be simplified, and the fabrication cost can be reduced, thereby enhancing productivity.

Furthermore, since the band-shaped organic EL strips are arranged at spacings, heat generated by the organic EL device can be effectively dissipated, thereby reducing degradation caused by heat. In addition, the spacings can reduce the heat resistance of the auxiliary terminal electrode to a level at which no variation in light emission can be visually identified.

The auxiliary terminal electrode preferably has an electric resistance lower than that of the other of the pair of electrodes. This configuration can further reduce the wiring resistance, thereby reducing the influence of a voltage drop. Specifically, the electric resistance of the auxiliary terminal electrode is preferably less than $5\times10^{-4}\Omega\cdot cm$, and more preferably $5\times10^{-6}\Omega\cdot cm$ or less.

At least one of the connection and auxiliary terminal electrodes is preferably connected to a side of each of the organic EL strips. In this configuration, at least one of the terminal electrodes can be electrically connected to each of the organic EL strips in a wide region, thereby more effectively reducing the wiring resistance.

For example, the auxiliary terminal electrode may have a plurality of extensions extending along the organic EL strips and each located between adjacent two of the organic EL strips, and a side of the other of the pair of electrodes in each of the organic EL strips may be electrically connected to the auxiliary terminal electrode through the extensions. In this configuration, connection can be easily established only by connecting the extensions and a side of each of the organic EL strips to each other.

In this case, the extensions are preferably connected to the other of the pair of electrodes through a conductive paste. Then, connection can be easily established at any time even after formation thereof.

The organic EL device with such a configuration can be manufactured at low cost because of additional formation of the organic EL strips.

Specifically, the organic EL device can be formed with a method including: an organic EL base formation step of stacking the pair of electrodes and the organic layer on a base substrate made of a same material as that for the second substrate and having an area larger than that of the second substrate, thereby forming an organic EL base; an organic EL strip formation step of dividing the organic EL base, thereby forming the plurality of organic EL strips; a terminal electrode formation step of forming the connection and auxiliary terminal electrodes by patterning on the first substrate; an organic EL strip attachment step of attaching each of the organic EL strips to a predetermined location of the first substrate on which the connection and auxiliary terminal electrodes have been formed by patterning; and an electrode connection step of electrically connecting one of the pair of electrodes to the connection terminal electrode and electrically connecting the other of the pair of electrodes to the auxiliary terminal electrode using a connector on the first substrate to which the organic EL strips have been attached.

With this method, an organic EL base can be formed with, for example, a roll-to-roll process, thereby allowing the organic EL base to be divided into a necessary number of organic EL strips. Main processes in fabrication of an organic EL device can be performed only by attaching organic EL strips to the first substrate on which the terminal electrodes have been formed. Accordingly, fabrication processes can be simplified, and the fabrication cost can be reduced.

In this case, the terminal electrode formation step may employ a plating process, a printing process, a vapor deposition process, for example. That is, the terminal electrodes can be formed by appropriately selecting a method from widely used methods, thereby increasing flexibility and, accordingly, enhancing productivity.

An organic EL illumination system including an organic EL device with a configuration as described above can exhibit excellent performance even at low cost.

Advantages of the Invention

According to the present disclosure, it is possible to provide a high-quality organic EL device and a high-quality organic EL illumination system at low cost.

DESCRIPTION OF EMBODIMENTS

An embodiments of the present disclosure will be specifically described hereinafter with reference to the drawings. The following embodiment is merely an example in nature, and is not intended to limit the scope, applications, and use of the invention.

<Configuration of Organic EL Device>

Figure 1:
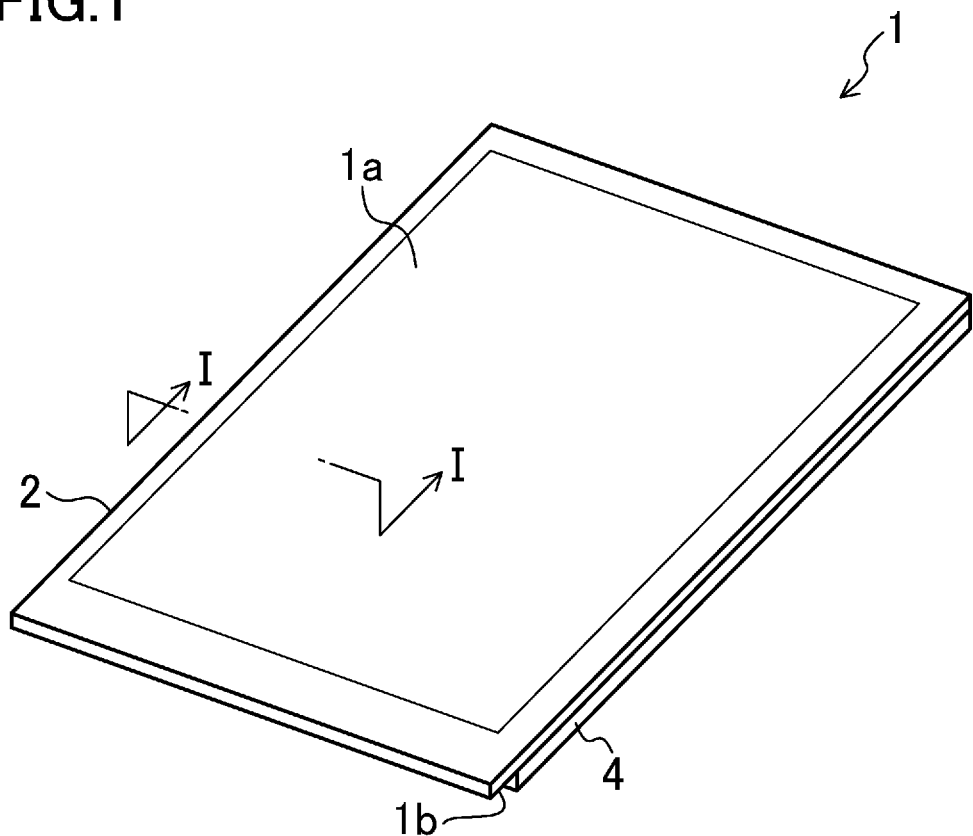
FIG. 1 is a view schematically illustrating an organic EL device provided in an organic EL illumination system according to an embodiment.
Figure 2:
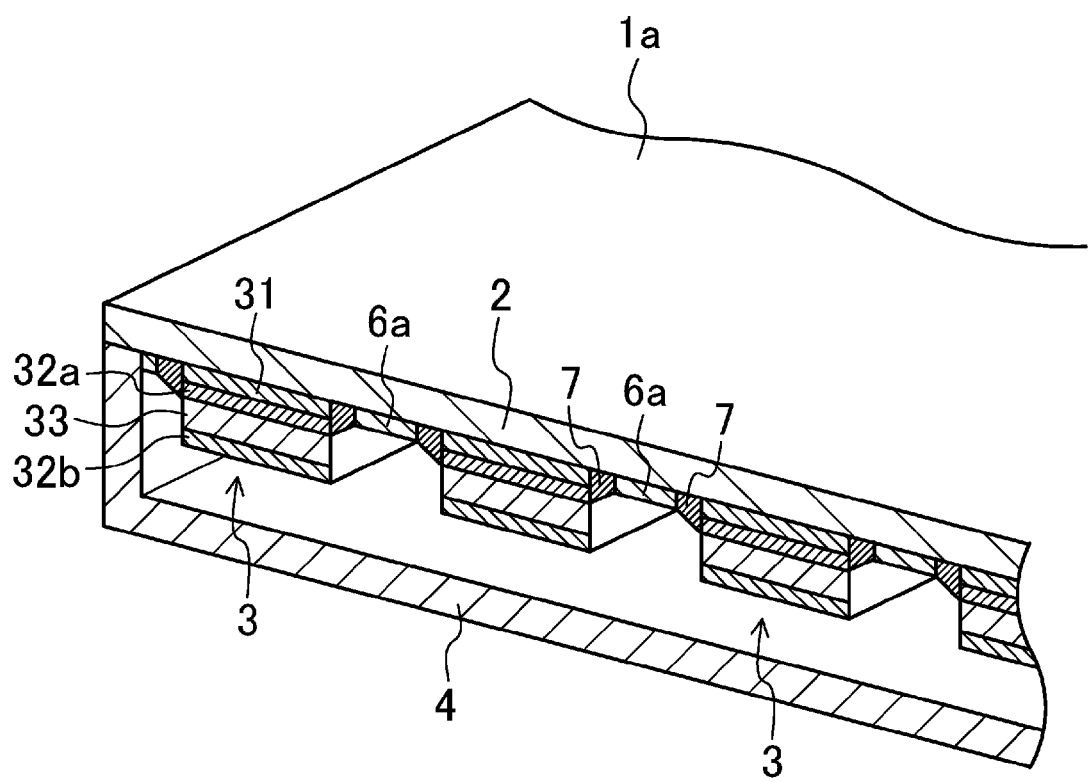
FIG. 2 is a partial view of an I-I cross section in FIG. 1.

FIG. 1 is a view schematically illustrating an organic EL device 1 provided in a thin organic EL illumination system according to an embodiment. FIG. 2 is a schematic view of an I-I cross section in FIG. 1.

As illustrated in FIG. 1, the organic EL device 1 has a rectangular plate shape, and a light-emission region 1a emitting white light is formed on a surface of the organic EL device 1. A connection terminal 1b to be connected to a terminal of the organic EL illumination system is provided at an end of the organic EL device 1.

As illustrated in FIG. 2, the organic EL device 1 includes a first substrate 2, a plurality of band-shaped organic EL strips 3, 3, . . . , and a sealing substrate 4, for example.

(First Substrate 2)

The first substrate 2 is a rectangular glass plate, for example. The first substrate 2 is not limited to a glass plate, and may be a resin plate or a resin sheet, for example. The shape of the first substrate 2 is not limited to a plate-shape, and may be cylindrical, spherical, or polygonal, for example. The first substrate 2 can be arbitrarily designed according to the design of the organic EL illumination system. The first substrate 2 includes a terminal electrode 5 for connection and a terminal electrode 6 as an auxiliary.

[Terminal Electrode 6]

Figure 3:
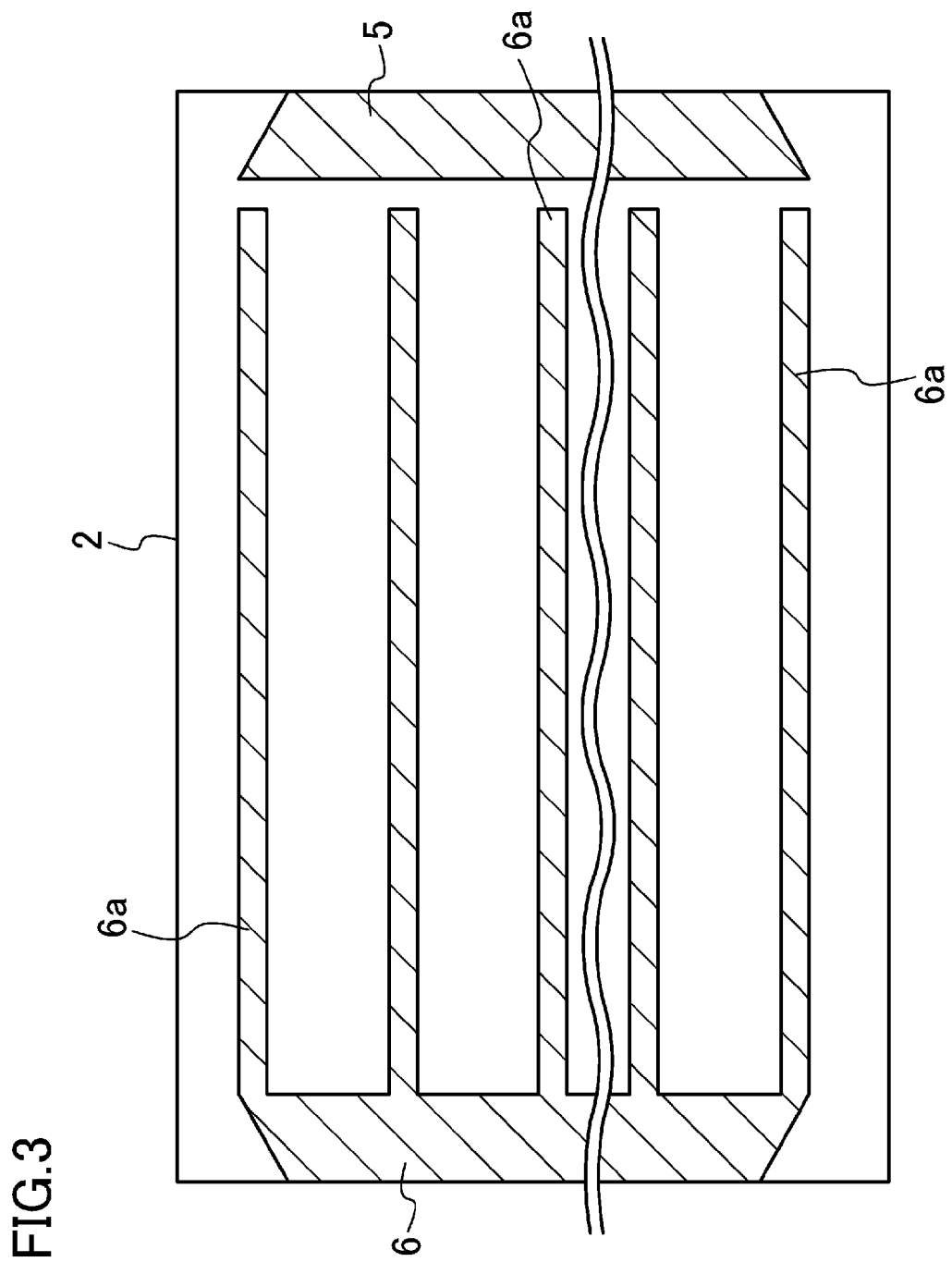
FIG. 3 is a plan view schematically illustrating a first substrate.

FIG. 3 illustrates the first substrate 2 (as a single unit) according to this embodiment. As illustrated in FIG. 3, a terminal electrode 5 for connection (hereinafter also referred to as a connection electrode 5) and a terminal electrode 6 as an auxiliary (hereinafter also referred to as an auxiliary electrode 6) are provided on a surface of the first substrate 2 respectively at both ends of the first substrate 2 to face each other. The connection electrode 5 and the auxiliary electrode 6 are wide at the respective ends of the first substrate 2. The auxiliary electrode 6 has a plurality of parallel extensions 6a, 6a, . . . extending toward the connection electrode 5. The auxiliary electrode 6 and the connection electrode 5 are disposed to be electrically disconnected from each other. The connection electrode 5 is electrically connected to the connection terminal 1b.

Each of the terminal electrodes 5 and 6 is formed to be a thin film using a material, such as gold, silver, nickel, and aluminium, having a high electric conductivity and a low electric resistance.

(Organic EL Strip 3)

Each of the organic EL strips 3 is formed into a rectangular band shape having a predetermined width and extending linearly. Each of the organic EL strips 3 is spaced apart from an adjacent one of the organic EL strips 3 at a predetermined spacing on the first substrate 2. The organic EL strips 3 of this embodiment are obtained by dividing an organic EL base 15 formed by a roll-to-roll process, and the formation of the organic EL strips 3 is independent of that of the first substrate 2. The organic EL strips 3 are attached and fixed to the first substrate 2.

Figure 4:
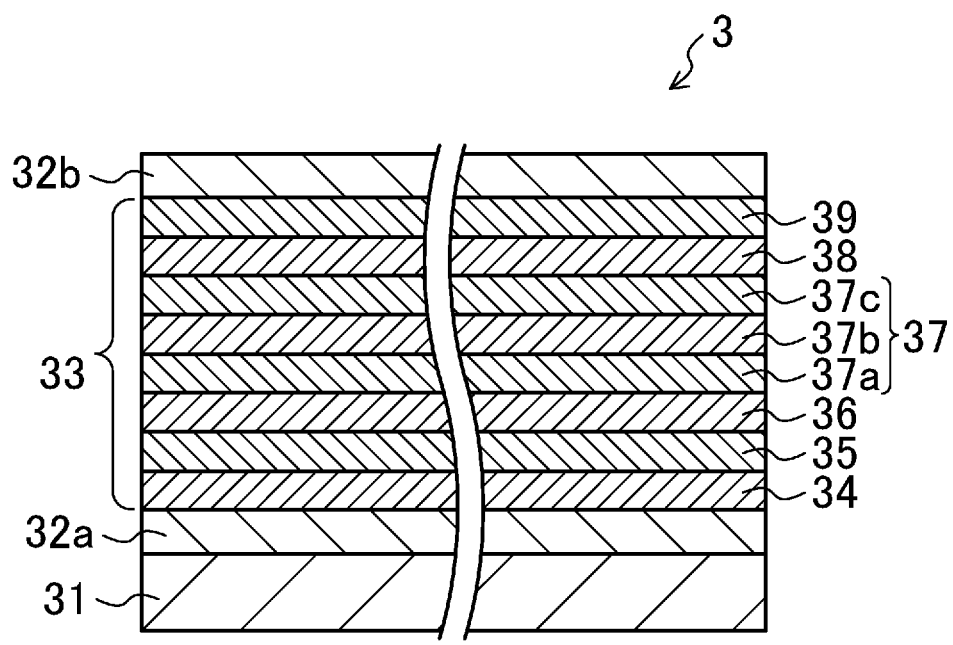
FIG. 4 is a cross-sectional view schematically illustrating an organic EL strip.

As specifically illustrated in FIG. 4, each of the organic EL strips 3 includes a band-shaped second substrate 31, a pair of band-shaped electrodes of a negative electrode 32b and a positive electrode 32a, and a band-shaped organic layer 33 configured to emit light upon application of a voltage. Specifically, the organic layer 33 as a stack of layers is sandwiched between the positive electrode 32a and the negative electrode 32b on the second substrate 31. More specifically, the positive electrode 32a, a hole injection layer 34, a hole transport layer 35, an electron blocking layer 36, a light emission layer 37, an electron transport layer 38, an electron injection layer 39, and the negative electrode 32b are stacked in this order (i.e., a structure of positive electrode/hole injection layer/hole transport layer/electron blocking layer/light emission layer/electron transport layer/electron injection layer/negative electrode is provided) on the second substrate 31. The light emission layer 37 of this embodiment includes a red-light emission layer 37a, a green-light emission layer 37b, and a blue-light emission layer 37c.

[Second Substrate 31]

The second substrate 31 is a flexible substrate capable of being wound into a roll shape. For example, a resin sheet of, for example, styrene resin, acrylic resin, or polyethylene terephthalate resin may be used for the second substrate 31. The resin sheet is preferably made of a material having a high degree of a barrier property to oxygen or water, and may be a single-layer sheet of a single resin or a multilayer sheet of a plurality of resins.

[Electrodes 32a and 32b]

Each of the electrodes 32a and 32b can be formed using conventional electrode materials. To efficiently inject holes into the organic layer 33, for example, the positive electrode 32a is preferably made of a metal having a high work function such as Au, Ag, Pt, or Ni. In the case of a bottom emission type in which light is emitted from the positive electrode 32a, a transparent electrode can be formed using ITO, IDIXO, GZO, or $SnO_2$, for example.

To efficiently inject electrons into the organic layer 33, for example, the negative electrode 32b is preferably formed by stacking a metal having a low work function, such as Ca/Al, Ce/Al, Cs/Al, or Ba/Al, and a stable metal. The negative electrode 32b may be made of an alloy containing a metal having a low work function such as a Ca—Al alloy, a Mg—Ag alloy, or a Li—Al alloy, or a combination of a thin insulating layer and a metal electrode such as LiF/Al, LiF/Ca/Al, $BaF_2$/Ba/Al, or LiF/Al/Ag. In the case of a top emission type in which light is emitted from the negative electrode 32b, when the negative electrode 32b has a thickness of 50 nm or less, the negative electrode 32b can be a semi-transparent film.

These electrodes may be formed by a dry process such as a vapor deposition process, an EB process, an MBE process, or a sputtering process, or a wet process such as a spin coating process, a printing process, or an ink jet process.

[Hole Injection Layer 34]

The hole injection layer 34 is provided in order to efficiently receive holes from the positive electrode 32a and efficiently transmit the holes to the hole transport layer 35. The HOMO level of a material used for the hole injection layer 34 is preferably lower than that for the hole transport layer 35, and higher than the work function of the positive electrode 32a. The hole injection layer 34 may be a single layer or a multilayer.

The hole injection layer 34 can be formed by a dry process such as a vapor deposition process using one or more materials. In this process, the hole injection layer 34 may contain an additive such as a donor or an acceptor. Alternatively, the hole injection layer 34 may be formed by a wet process using a deposition solution obtained by dissolving one or more materials in a solvent. In this process, the deposition solution may contain a binding resin, a levelling agent, and an additive such as a donor or an acceptor.

The binding resin may be a polycarbonate or polyester, for example. The solvent only needs to be a solvent in which a material/materials can be dissolved or dispersed, and may be pure water, methanol, ethanol, THF, chloroform, xylene, trimethylbenzene, for example.

The hole injection layer 34 can be made of a material generally used for an organic EL device or an organic photoconductor. Examples of a material for the hole injection layer 34 include an inorganic p-type semiconductor material, a porphyrin compound, an aromatic tertiary amine compound such as N,N'-bis-(3-methylphenyl)-N,N'-bis-(phenyl)-benzidine (TPD), and N,N'-di(naphthalene-1-yl)-N,N'-diphenylbenzidine (NPD), a low-molecular material such as a hydrazone compound, a quinacridone compound, and a styrylamine compound, a polymeric material such as polyaniline (PANI), 3,4-polyethylenedioxythiophene/polystyrene sulfonate (PEDT/PSS), poly[triphenylamine derivative] (Poly-TPD), polyvinylcarbazole (PVCz), and a polymeric material precursor such as a poly(p-phenylenevinylene) precursor (Pre-PPV) and a poly(p-naphthalenevinylene) precursor (Pre-PNV).

[Hole Transport Layer 35]

The hole transport layer 35 is provided in order to efficiently receive holes from the hole injection layer 34 and efficiently transmit the holes to the light emission layer 37. The HOMO level of a material for the hole transport layer 35 is preferably higher than that of the hole injection layer 34 and lower than that of the light emission layer 37. This is because this range of the HOMO level allows holes to be more efficiently injected and transported to the light emission layer 37 to achieve reduction of a voltage necessary for light emission and increase in light-emission efficiency.

In addition, to reduce leakage of electrons from the light emission layer 37, the LUMO level of the hole transport layer 35 is preferably lower than that of the light emission layer 37. This range can increase the light-emission efficiency in the light emission layer 37. The band gap of the hole transport layer 35 is preferably larger than that of the light emission layer 37. This range enables effective confinement of excitons in the light emission layer 37.

The hole transport layer 35 may be a single layer or a multilayer, and can be formed in the same manner as the hole injection layer 34, using a dry process or a wet process.

[Electron Blocking Layer 36]

The electron blocking layer 36 may be made of a material in the same type as that for the hole injection layer 34. It should be noted that the absolute value of the LUMO level of this material is preferably smaller than that of a material for the light emission layer 37, i.e., the red-light emission layer 37a, in contact with the electron blocking layer 36. This is because this range enables electrons to be more effectively confined in the light emission layer 37.

The electron blocking layer 36 may also be a single layer or a multilayer, and can be formed in the same manner as the hole injection layer 34, using a dry process or a wet process.

[Light Emission Layer 37]

The light emission layer 37 is configured to emit white light by combining the red-light emission layer 37a, the green-light emission layer 37b, and the blue-light emission layer 37c. The light emission layer 37 may be a single layer to emit light of color except for white without using a combination of the light emission layers 37a to 37c emitting light of different colors. Each of the light emission layers 37a to 37c may contain only one light-emission material, or two or more light-emission materials. In addition, each of the light emission layers 37a to 37c may contain the material for the hole transport layer 35 and/or the material for the electron transport layer 38.

The light emission layer 37 can be made of a material generally used for organic EL devices.

Specifically, examples of a low-molecular material include an aromatic dimethyliden compound such as 4,4'-bis(2,2'-diphenylvinyl)-biphenyl (DPVBi), an oxadiazole compound such as 5-methyl-2-[2-[4-(5-methyl-2-benzoxazolyl)phenyl]vinyl]benzoxazole, a triazole derivative such as 3-(4-biphenylyl)-4-phenyl-5-t-butylphenyl-1,2,4-triazole (TAZ), a styrylbenzene compound such as 1,4-bis(2-methylstyryl)benzene, a fluorescent organic material such as a thiopyrazinedioxide derivative, a benzoquinone derivative, a naphthoquinone derivative, an anthraquinone derivative, a diphenoquinone derivative, and a fluorenone derivative, a fluorescent organic metal compound such as an azomethine zinc complex and an (8-hydroxyquinolinate) aluminium complex (Alq3).

Examples of a polymeric material include poly(2-decyloxy-1,4-phenylene) (DO-PPP), poly[2,5-bis-[2-(N,N,N-triethylammonium)ethoxy]-1,4-phenyl-o-1,4-phenylene]dibromide (PPP-Net3+), poly[2-(2'-ethylhexyloxy)-5-methoxy-1,4-phenylenevinylene] (MEH-PPV), poly[5-methoxy-(2-propanoxysulfonide)-1,4-phenylenevinylene] (MPS-PPV), poly[2,5-bis-(hexyloxy)-1,4-phenylene-(1-cyanovinylene)] (CN-PPV), poly(9,9-dioctylfluorene) (PDAF), and polyspiro. In addition, a precursor of a polymeric material such as a PPV precursor, a PNV precursor, or a PPP precursor may be used.

The light emission layer 37 may also be formed in the same manner as the hole injection layer 34, using a dry process or a wet process.

[Electron Transport Layer 38]

The electron transport layer 38 is provided to efficiently receive electrons from the electron injection layer 39 and efficiently transmit the electrons to the light emission layer 37. The LUMO level of a material used for the electron transport layer 38 is preferably between the LUMO level of the electron injection layer 39 and the LUMO level of the light emission layer 37. This is because this range of the LUMO level allows electrons to be more efficiently injected and transported to the light emission layer 37 to achieve reduction of a voltage necessary for light emission and increase in light-emission efficiency.

In addition, to reduce leakage of holes from the light emission layer 37, the HOMO level of the electron transport layer 38 is preferably higher than that of the light emission layer 37. This range can increase the light-emission efficiency in the light emission layer 37. The band gap of the electron transport layer 38 is preferably larger than that of the light emission layer 37. This range enables effective confinement of excitons in the light emission layer 37.

The electron transport layer 38 may also be a single layer or a multilayer, and can be formed in the same manner as the hole injection layer 34, using a dry process or a wet process.

Examples of a material for the electron transport layer 38 include an inorganic material of an n-type semiconductor, a low-molecular material such as an oxadiazole derivative, a triazole derivative, a thiopyrazinedioxide derivative, a benzoquinone derivative, a naphthoquinone derivative, an anthraquinone derivative, a diphenoquinone derivative, and a fluorenone derivative, and a polymeric material such as poly (oxadiazole) (Poly-OXZ), and a polystyrene derivative (PSS).

[Electron Injection Layer 39]

The electron injection layer 39 is provided in order to efficiently receive electrons from the negative electrode 32b and efficiently transmit the electrons to the electron transport layer 38. Examples of a material for the electron injection layer 39 include a fluoride such as lithium fluoride (LiF) and barium fluoride (BaF2), and an oxide such as lithium oxide (Li2O).

To efficiently inject and transport electrons, the material for the electron injection layer 39 preferably has a LUMO level higher than that for the electron transport layer 38. The material for the electron transport layer 38 preferably has an electron mobility higher than that for the electron injection layer 39.

The configuration of the organic layer 33 is not limited to that described above, and may be modified as necessary. For example, the structure of hole transport layer/light emission layer/electron transport layer, the structure of hole injection layer/hole transport layer/light emission layer/electron transport layer/electron injection layer, or the structure of hole injection layer/hole transport layer/electron blocking layer/light emission layer/hole blocking layer/electron injection layer, may be employed.

After the negative electrode 32b has been formed, a protection film covering the negative electrode 32b may be formed in order to reduce entering of, for example, moisture and damage caused by an impact upon winding into a roll shape, for example.

The protection film may be formed by, for example, an EB vapor deposition process, a sputtering process, an ion plating process, or a resistance heating vapor deposition process. The protection film may be made of a metal such as Al or Ag, an organic material such as phthalocyanine, or an inorganic material such as SiON, SiO, or SiN.

The layers forming the organic layer 33 may be formed by a dry process such as a vacuum vapor deposition process, or a wet process such as a doctor blade process, a dip coating process, a microgravure process, a spraying process, an ink jet process, or a printing process. The wet process is preferably performed under an inert gas atmosphere or a vacuum condition in consideration of influences of oxygen and moisture on the light emission layer 37 or other components. After the layers have been formed, a drying process such as heating is preferably performed in order to remove a solvent. In this case, the drying process is preferably performed in an inert gas atmosphere, and is more preferably performed under a reduced pressure.

The positive electrode 32a of each of the organic EL strips 3 is electrically connected to an associated one of the extensions 6a of the auxiliary electrode 6 through a conductive paste 7 (a connector) having an electric resistance lower than that of the positive electrode 32a and a high electric conductivity. The negative electrode 32b of each of the organic EL strips 3 is electrically connected to the connection electrode 5 through the conductive paste 7.

[Connection of Organic EL Strips 3 to Terminal Electrodes 5 and 6]

Figure 5:
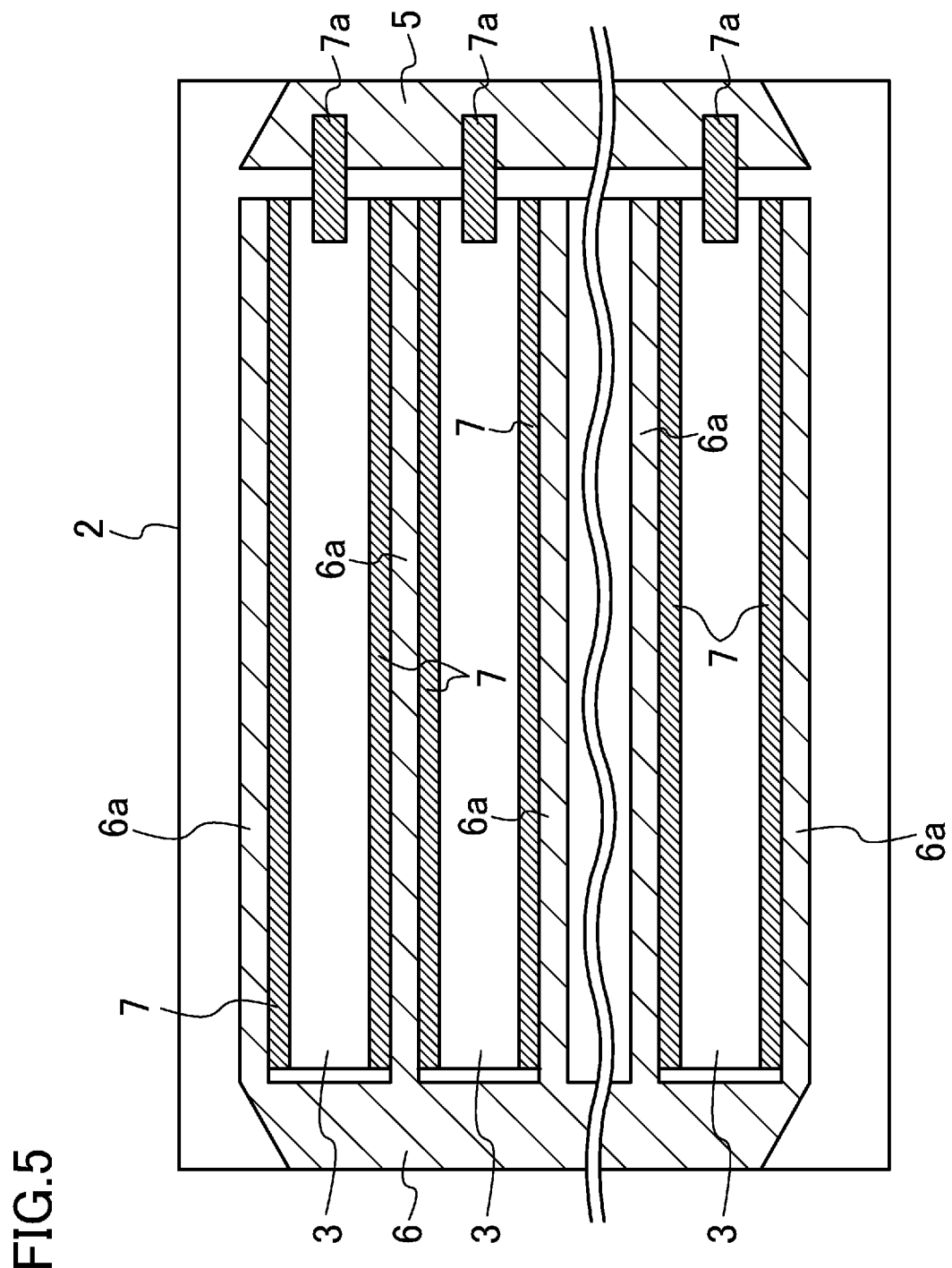
FIG. 5 is a plan view schematically illustrating a main portion of the organic EL device.

FIG. 5 is a plan view illustrating the organic EL device 1 in a state in which the organic EL strips 3 are electrically connected to the terminal electrodes 5 and 6. The organic EL strips 3 are arranged at spacings, and extend substantially in parallel with each other between the auxiliary electrode 6 and the connection electrode 5. Each of the extensions 6a extends along the organic EL strips 3, and is located between adjacent two of the organic EL strips 3 and 3.

Figure 6:
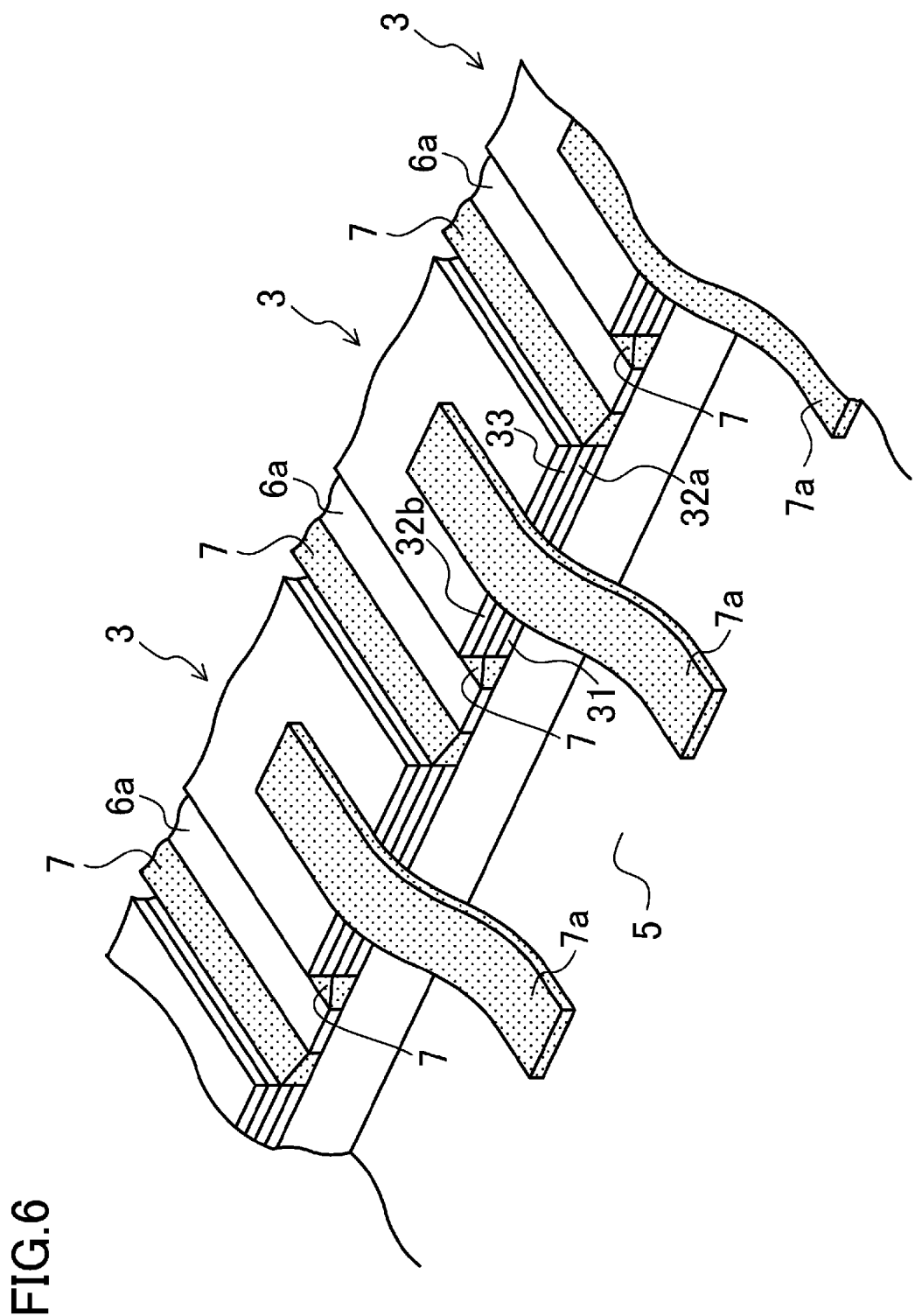
FIG. 6 is a perspective view schematically illustrating a main portion of the organic EL device.

As also illustrated in FIG. 6, the conductive paste 7 is provided to fill a gap between each of the organic EL strips 3 and an associated one of the extensions 6a. The positive electrode 32a and the extensions 6a are electrically connected to each other through the conductive paste 7. Specifically, the positive electrode 32a is electrically connected to the auxiliary electrode 6 in a wide region from one end to the other end in the longitudinal direction thereof. Accordingly, current easily flows in the positive electrode 32a of each of the organic EL strips 3 through the auxiliary electrode 6, thereby effectively reduce the influence of a voltage drop.

On the other hand, the negative electrode 32b is electrically connected to the connection electrode 5 via an arched conductive paste 7a provided between the connection electrode 5 and an end of an adjacent one of the organic EL strips 3.

(Sealing Substrate 4)

The sealing substrate 4 only needs to seal the surface of the first substrate 2 on which the organic EL strips 3 and other components are provided. Examples of the sealing method include a method of hermetically enclosing an inert gas such as a nitrogen gas or an argon gas with, for example, glass or a metal, and a method of placing an moisture absorbent such as barium oxide in an inert gas. The sealing substrate 4 can reduce exposure of the light emission layer 37 to oxygen and moisture, thereby increasing the lifetime of the organic EL device 1.

<Method for Fabricating Organic EL Device 1>

The organic EL device 1 with the configuration as described above can be easily fabricated with, for example, a fabrication method including the following steps (1)-(5):

(1) A pair of electrodes 32a and 32b and an organic layer 33 are stacked on a base substrate 13 made of the same material as that for a second substrate 31 and having an area larger than that of the second substrate 31, thereby forming an organic EL base 15 (an organic EL base formation step). This step preferably employs a roll-to-roll process.

Figure 7:
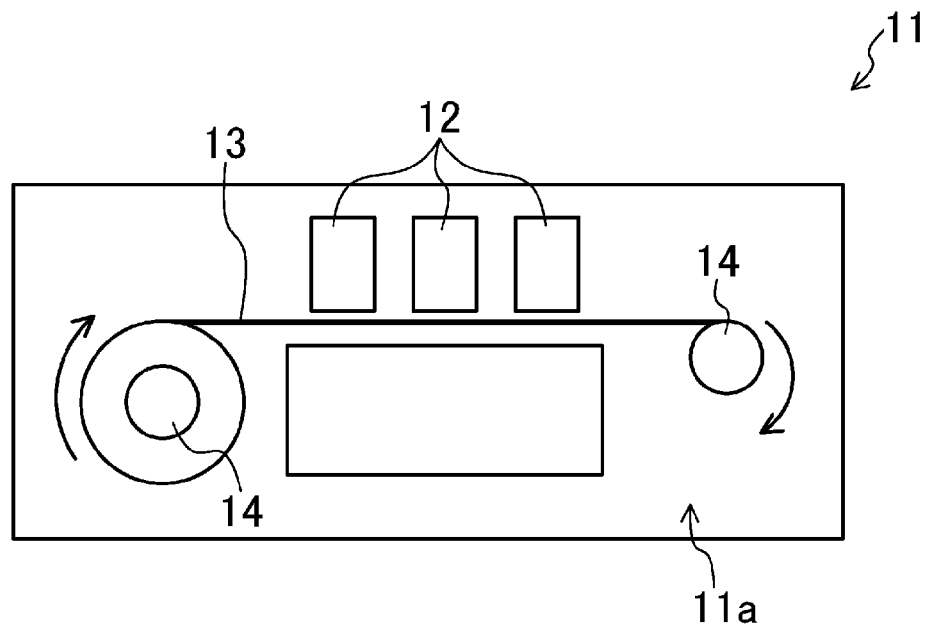
FIG. 7 is a view schematically showing a deposition apparatus based on a roll-to-roll process.

FIG. 7 is a view schematically illustrating a deposition apparatus 11 based on a roll-to-roll process. Various deposition means 12 such as a vapor deposition unit are provided in a chamber 11a of the deposition apparatus 11. The base substrate 13 can be wound into a roll shape. Reference character 14 denotes a pair of shafts for alternately winding the base substrate 13 under predetermined conditions. The chamber 11a of the deposition apparatus 11 is configured to be switched to a nitrogen atmosphere or a vacuum condition. The use of such a deposition apparatus 11 allows films to be sequentially formed to be stacked on the base substrate 13 under predetermined deposition conditions, while winding the base substrate 13 from one shaft 14 to the other shaft 14. Accordingly, even a plurality of layers made of different materials, having different structures, and deposited by different processes, can be relatively easily stacked, thereby manufacturing organic EL bases 15 at low cost.

Figure 8:
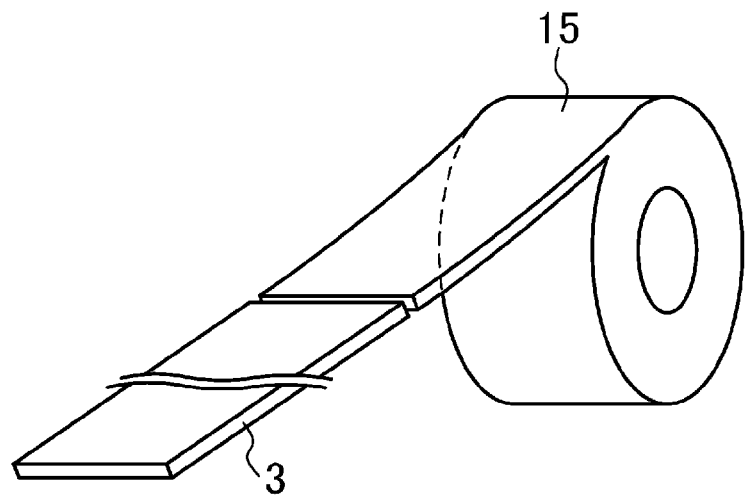
FIG. 8 is a view showing an organic EL strip formation step.

(2) The organic EL base 15 is divided, thereby forming a plurality of organic EL strips 3 (an organic EL strip formation step). Specifically, since the organic EL base 15 has the same layered structure as the organic EL strips 3, only dividing the organic EL base 15 into predetermined sizes as illustrated in FIG. 8 easily obtains a necessary number of organic EL strips 3. At this time, the positive electrode 32a is exposed at the side surface of each of the organic EL strips 3.

(3) A connection electrode 5 and an auxiliary electrode 6 are formed by patterning on a first substrate 2 (a terminal electrode formation step). Specifically, before or after the organic EL base formation step and the organic EL strip formation step, the connection electrode 5 and the auxiliary electrode 6 are formed by patterning on the first substrate 2. Each of the terminal electrodes 5 and 6 is formed by patterning using, for example, a plating process, a printing process, or a vapor deposition process (e.g., a resistance heating vapor deposition process, an EB vapor deposition process, or a sputtering vapor deposition process).

Specifically, in the case of a plating process, patterning can be performed with electroless plating or a laser. In the case of a printing process, patterning can be performed with, for example, relief printing, intaglio printing, lithographic printing, an ink jet process, or screen printing. In the case of a vapor deposition process, patterning can be performed by a mask vapor deposition process using a shadow mask, or by depositing a metal film and performing photolithography using the metal film.

(4) Each of the organic EL strips 3 is attached to a predetermined location of the first substrate 2 on which the connection electrode 5 and the auxiliary electrode 6 are formed by patterning (an organic EL strip attachment step). The second substrate 31 of each of the organic EL strips 3 is attached to a predetermined location of the first substrate 2, i.e., a location between two adjacent extensions 6a and 6a. Since the organic EL strips 3 only need to be attached, the first substrate 2 does not need to be flat, and may be curved or bent. Even in such a case, the organic EL strips 3 can be easily attached. Since the organic layer 33 or other components do not need to be formed directly on the first substrate 2, the process is simplified, thus reducing the fabrication cost.

(5) On the first substrate 2 provided with the organic EL strips 3, using a conductive paste 7, the negative electrode 32b and the connection electrode 5 are electrically connected to each other, and the positive electrode 32a and the auxiliary electrode 6 are electrically connected to each other (an electrode connection step).

As illustrated in FIG. 6, since the positive electrode 32a is exposed at a side surface of each of the organic EL strips 3, only the conductive paste 7 provided in gaps between the extensions 6a and the organic EL strips 3 and extending from the first substrate 2 to a predetermined height above the second substrate 31, allows the positive electrode 32a and the extensions 6a to be electrically connected to each other with ease. In addition, since the negative electrode 32b is provided in the uppermost layer at an end of each of the organic EL strips 3, the negative electrode 32b can be easily electrically connected to the connection electrode 5.

EXAMPLES

Now, first through third examples of the present disclosure will be described hereinafter.

First Example

A positive electrode 32a of indium oxide-tin oxide (ITO) was formed on a surface of a band-shaped PET film (a base substrate 13) wound into a roll shape of 10 m×20 mm, thereby forming a base substrate provided with the positive electrode. To remove foreign substances, the base substrate provided with the positive electrode was subjected to ultrasonic cleaning using acetone or IPA for 10 minutes.

After the cleaning, the base substrate provided with the positive electrode was placed in a deposition apparatus 11 based on a roll-to-roll process, and an organic layer 33 and a negative electrode 32b were deposited under predetermined conditions. Specifically, each of the organic layer 33 and the negative electrode 32b was deposited to a predetermined thickness with control of the vapor deposition speed during deposition of each layer/electrode while the base substrate provided with the positive electrode was transferred at a constant speed of 1 m/min.

First, with a vacuum vapor deposition process, a hole injection layer 34 was deposited to a thickness of 30 nm over the positive electrode 32a using a copper phthalocyanine (CuPc). Then, a hole transport layer 35 with a thickness of 20 nm was formed on the hole injection layer 34 using 4'-bis[N-(1-naphthyl)-N-phenyl-amino]biphenyl) (α-NPD). An electron blocking layer 36 with a thickness of 10 nm was formed on the hole transport layer 35 using 4,4'-bis-[N,N'-(3-tolyl) amino-3,3'-dimethylbiphenyl (HMTPD).

A charge transport red-light emission layer 37a (with a thickness of, for example, 20 nm) capable of transporting both holes and electrons was formed on the electron blocking layer 36. This charge transport red-light emission layer 37a was formed by codepositing α-NPD which is a material for the hole transport layer 35, 3-phenyl-4(1-naphthyl)-5-phenyl-1,2,4-triazole (TAZ) which is a material for the electron transport layer 38, and bis(2-(2'-benzo[4,5-a]thienyl)pyridinato-N, C3')iridium(acetylacetonate) (btp2Ir(acac)) which is a red-light emission dopant, while controlling the vapor deposition speed at 0.6:1.4:0.15.

A charge transport green-light emission layer 37b (with a thickness of, for example, 20 nm) capable of transporting both holes and electrons was formed on the charge transport red-light emission layer 37a. This charge transport green-light emission layer 37b was formed by codepositing α-NPD which is a material for the hole transport layer 35, TAZ which is a material for the electron transport layer 38, and Ir(ppy)$_3$ which is a green-light emission dopant, while controlling the vapor deposition speed at 1.0:1.0:0.1.

A charge transport blue-light emission layer 37c (with a thickness of, for example, 10 nm) capable of transporting both holes and electrons was formed on the charge transport green-light emission layer 37b. This charge transport blue-light emission layer 37c was formed by codepositing α-NPD which is a material for the hole transport layer 35, TAZ which is a material for the electron transport layer 38, and 2-(4'-t-butylphenyl)-5-(4"-biphenylyl)-1,3,4-oxadiazole (tBu-PBD) which is a blue-light emission dopant, while controlling the vapor deposition speed at 1.5:0.5:0.2. These three light emission layers 37a to 37c form a light emission layer 37 which emits white light.

A hole blocking layer with a thickness of 10 nm is formed on the light emission layer 37 using 2,9-dimethyl-4,7-diphenyl-1,10-phenanthroline (BCP). An electron transport layer 38 with a thickness of 30 nm was formed on the hole blocking layer using tris(8-hydroxyquinoline)aluminium (Alq3). An electron injection layer 39 with a thickness of 1 nm was formed on the electron transport layer 38 using lithium fluoride (LiF).

Then, aluminium was deposited to a thickness of, for example, 300 nm over the electron injection layer 39, thereby forming a negative electrode 32b. Thereafter, a protection film of SiON with a thickness of 100 nm was formed on the negative electrode 32b by an ion plating process, thereby obtaining an organic EL base 15 wound into a roll shape.

Before or after the formation of the organic EL base 15, a process of forming an auxiliary electrode 6 and a connection electrode 5 on the first substrate 2 was performed (a terminal electrode formation step). Specifically, as illustrated in FIG. 3, an auxiliary electrode 6 of nickel and a connection electrode 5 of nickel were formed by patterning on a glass substrate with a known electroless nickel plating process.

More specifically, first, a surface of a glass substrate (a first substrate 2) as a target of plating was subjected to a reforming treatment including roughening and hydrophilizing (a surface reforming treatment). The glass substrate subjected to the reforming treatment was provided with a catalyst nucleus of electroless plating (a nucleus provision treatment), and the catalyst nucleus was activated (an activation treatment). Then, the glass substrate was immersed in an electroless plating solution (an immersion treatment), thereby forming an electroless plating film.

Patterning was performed in the following manner. First, before the immersion treatment, a paste was prepared by mixing an electroless plating catalyst component such as metallic palladium which facilitates plating in a photosensitive resin. Using this paste, the catalyst nucleus layer was patterned by photolithography.

The resultant organic EL base 15 was divided into six organic EL strips 3 each having a size of 15 cm×20 mm. Each of the six organic EL strips 3 was attached to a predetermined location of the glass substrate on which the auxiliary electrode 6 and the connection electrode 5 were provided.

The positive electrode 32a of each of the organic EL strips 3 was electrically connected to the auxiliary electrode 6 using an UV setting conductive paste 7. The negative electrode 32b of each of the organic EL strips 3 was also electrically connected to the connection electrode 5 using an UV setting conductive paste 7.

Lastly, a sealing glass substrate (a sealing substrate 4) was fixed to the glass substrate using UV setting resin, and the organic EL strips 3 were sealed. A desiccating agent was placed in a hermetically sealed space defined by the glass substrate and the sealing glass substrate. To prevent degradation of the organic layer 33 caused by, for example, moisture, processes such as the division of the organic EL strips 3 were performed in a dry-air booth or a glove box.

Using the fabricated organic EL device 1, a voltage of 10V was applied. Then, white light emission of 5000 cd/m$^2$ was obtained. No variation in light emission due to a voltage drop was observed. The electric resistance of the positive electrode 32a was 5×10$^{-4}$ Ω·cm, and the electric resistance of the auxiliary electrode 6 was 5×10$^{-6}$ Ω·cm. That is, the auxiliary electrode 6 had an electric resistance lower than that of the positive electrode 32a, and connection of these electrodes in a wide region reduced the wiring resistance, thereby reducing a variation in light emission.

Second Example

This second example is different from the first example in that the plating process is replaced by a printing process in the terminal electrode formation step and that silver was used as a material for the auxiliary electrode 6, for example. Accordingly, formation of the organic EL strips 3, for example, is the same as that in the first example, and description thereof will not be repeated.

In this example, a conductive paste containing silver was used, and an auxiliary electrode 6 of silver and a connection electrode 5 of silver were formed by patterning on a glass substrate with a known screen printing process. After the patterning, to cure a conductive paste, a drying process of heating for 15 minutes was performed in an atmosphere of 120° C. Thereafter, processes similar to those in the first example were performed, thereby fabricating an organic EL device 1.

Using this organic EL device 1, a voltage of 10V was applied. Then, white light emission of 5000 cd/m$^2$ was obtained. No variation in light emission due to a voltage drop was observed. The electric resistance of the positive electrode 32a was 5×10$^{-4}$ Ω·cm, and the electric resistance of the auxiliary electrode 6 was 2×10$^{-6}$ Ω·cm.

Third Example

This third example is different from the first example in that the plating process is replaced by a vapor deposition process in the terminal electrode formation step, and that aluminium (Al) was used as a material for the auxiliary electrode 6, for example. Accordingly, formation of the organic EL strips 3, for example, is the same as that in the first example, and description thereof will not be repeated.

In this example, a shadow mask with a predetermined pattern was prepared. Then, an auxiliary electrode 6 of Al and a connection electrode 5 of Al were formed by patterning on a glass substrate with a known electron beam (EB) vapor deposition process. Thereafter, processes similar to those in the first example were performed, thereby fabricating an organic EL device 1.

Using this organic EL device 1, a voltage of 10V was applied. Then, white light emission of 5000 cd/m$^2$ was obtained. No variation in light emission due to a voltage drop was observed. The electric resistance of the positive electrode 32a was 5×10$^{-4}$ Ω·cm, and the electric resistance of the auxiliary electrode 6 was 5×10$^{-6}$ Ω·cm.

The organic EL device 1 and other components of the present disclosure are not limited to the embodiment described above, and various configurations may be employed.

Figure 9:
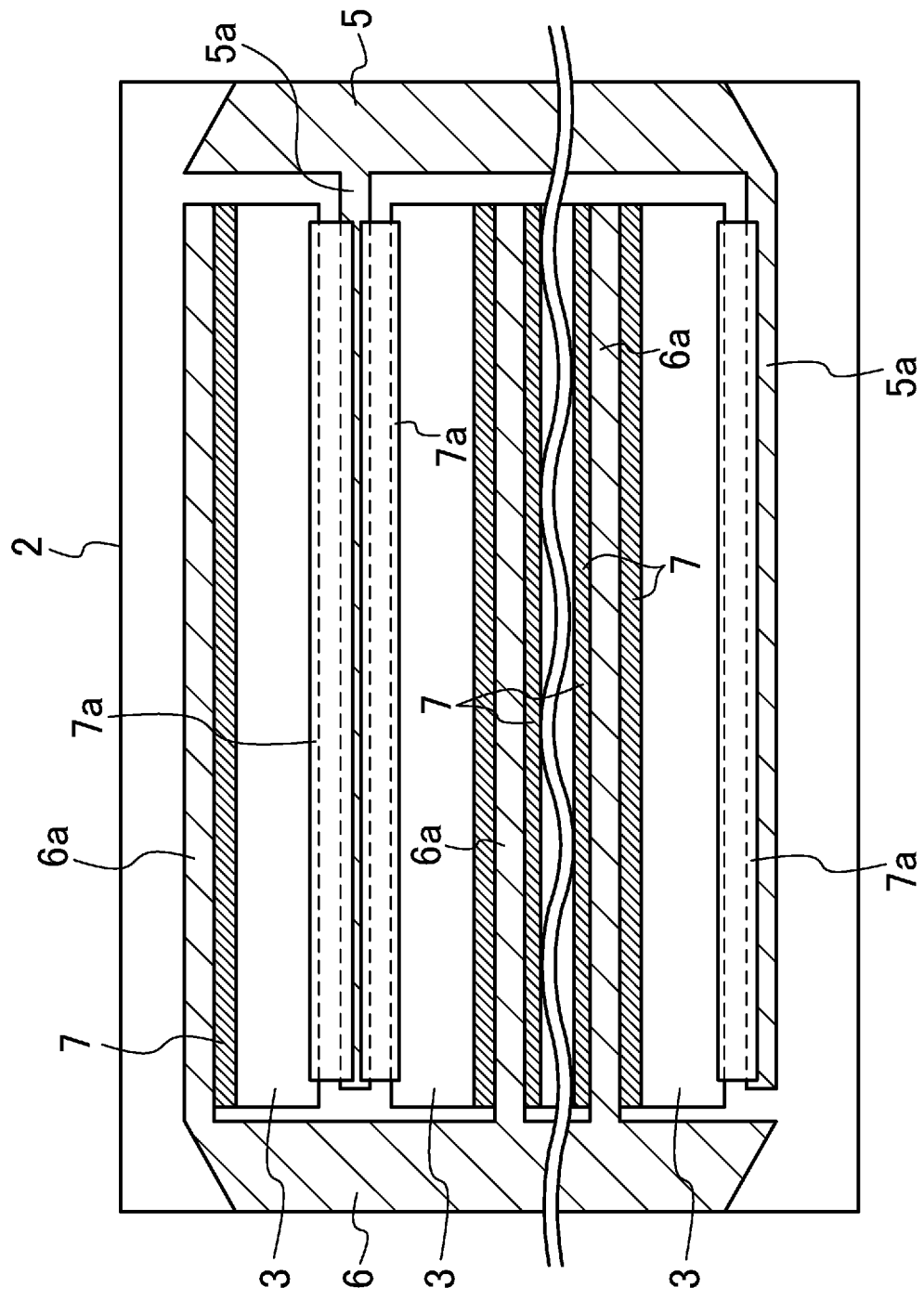
FIG. 9 is a view illustrating a variation of the organic EL device, and corresponds to FIG. 5.

For example, as illustrated in FIG. 9, the connection terminal electrode 5 may have extensions 5a. Specifically, in this configuration, the extensions 6a and the extensions 5a are alternately arranged such that the extensions 6a of the auxiliary electrode 6 are located at one side of each of the organic EL strips 3 and the extensions 5a of the connection electrode 5 are located at the other side. Then, the extensions 6a of the auxiliary electrode 6 are connected to the positive electrode 32a through the conductive paste 7 at one side of each of the organic EL strips 3, and the extensions 5a of the connection electrode 5 are connected to the negative electrode 32b at the other side through the conductive paste 7a. Then, the electrodes 32a and 32b can be connected to the terminal electrodes 5 and 6 in wide regions, thereby more effectively reducing the wiring resistance.

Each of the organic EL strips 3 is not limited to a linear shape with a constant width. The organic EL strips 3 may be curved or bent, may not have a constant width, and may be arbitrarily designed as necessary. The positions of the positive electrode 32a and the negative electrode 32b may be replaced.

Figure 10A:
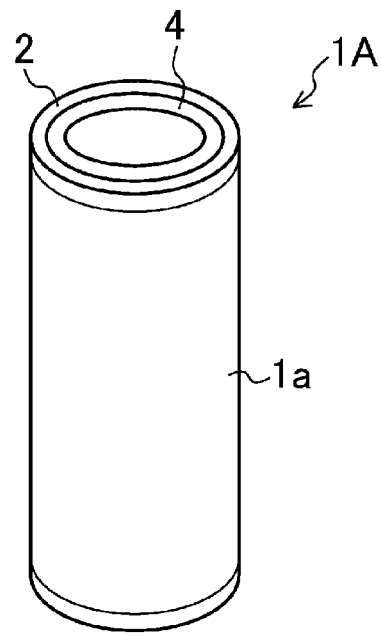
FIGS. 10A-10C are conceptual views showing variations of the organic EL device.
Figure 10B:
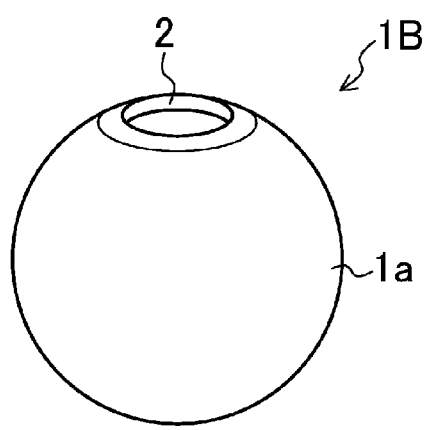
Figure 10C:
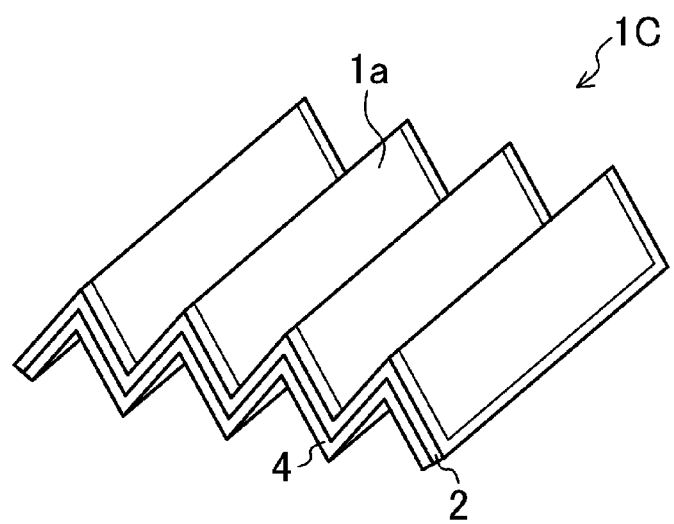

In the above embodiment, the plate-shaped organic EL device 1 has been described. Alternatively, illustrated in FIG. 10A, the present disclosure is also applicable to various forms, e.g., a cylindrical organic EL device 1A as illustrated in FIG. 10A, a spherical organic EL device 1B as illustrated in FIG. 10B, or a bent waved organic EL device 1C as illustrated

DESCRIPTION OF REFERENCE CHARACTERS 1 organic EL device
2 first substrate
3 organic EL strip
4 sealing substrate
5 connection terminal electrode
6 auxiliary terminal electrode
6a extension
7 conductive paste (connector)
11 deposition apparatus
13 base substrate
15 organic EL base
31 second substrate
32 electrode
32a positive electrode
32b negative electrode
33 organic layer
34 hole injection layer
35 hole transport layer
36 electron blocking layer
37 light emission layer
37a red-light emission layer
37b green-light emission layer
37c blue-light emission layer
38 electron transport layer
39 electron injection layer

The invention claimed is:

1. An organic electroluminescence (EL) device, comprising:
 a first substrate; and
 a plurality of band-shaped organic EL strips, each organic EL strip spaced apart from an adjacent organic EL strip, attached to the first substrate, and formed independently of the first substrate, wherein
 each of the organic EL strips includes
  a band-shaped second substrate,
  a pair of band-shaped electrodes of a negative electrode and a positive electrode, and
  a band-shaped organic layer configured to emit light upon application of a voltage,
 the pair of band-shaped electrodes is provided on the second substrate with the organic layer sandwiched between the pair of band-shaped electrodes,
 the first substrate includes
  a connection terminal electrode capable of being electrically connected to an external device, and
  an auxiliary terminal electrode electrically disconnected from the connection terminal electrode,
 one of the pair of band-shaped electrodes is electrically connected to the connection terminal electrode by a connector, and
 the other one of the pair of band-shaped electrodes is electrically connected to the auxiliary terminal electrode by the connector.

2. The organic EL device of claim 1, wherein the auxiliary terminal electrode has an electric resistance lower than that of the other one of the pair of band-shaped electrodes.

3. The organic EL device of claim 1, wherein at least one of the connection and auxiliary terminal electrodes is connected to a side of each of the organic EL strips.

4. The organic EL device of claim 3, wherein the auxiliary terminal electrode has a plurality of extensions extending along the organic EL strips and located between adjacent two of the organic EL strips, and
 a side of the other one of the pair of band-shaped electrodes in each of the organic EL strips is electrically connected to the auxiliary terminal electrode through the plurality of extensions.

5. The organic EL device of claim 4, wherein the plurality of extensions are connected to the other one of the pair of band-shaped electrodes through a conductive paste.

6. An organic electroluminescence (EL) illumination system, comprising the organic electroluminescence (EL) device of claim 1.

7. The organic EL device of claim 1, wherein the connector is a conductive paste.

8. The organic EL device of claim 1, wherein the first substrate is cylindrical.

9. The organic EL device of claim 1, wherein the first substrate is spherical.

10. The organic EL device of claim 1, wherein the first substrate is bent and waved.

11. A method for fabricating an organic electroluminescence (EL) device, the method comprising:
 an organic EL base formation step of stacking a pair of electrodes and an organic layer on a base substrate thereby forming an organic EL base;
 a band-shaped an organic EL strip formation step of dividing the organic EL base, thereby forming a plurality of band-shaped organic EL strips formed independently of a first substrate, wherein each of the organic EL strips includes a band-shaped second substrate, a pair of band-shaped electrodes of a negative electrode and a positive electrode, and a band-shaped organic layer configured to emit light upon application of a voltage, and the pair of band-shaped electrodes is provided on the second substrate with the organic layer sandwiched between the pair of band-shaped electrodes;
 a terminal electrode formation step of forming a connection terminal electrode and an auxiliary terminal electrode by patterning on the first substrate, wherein the connection terminal electrode is capable of being electrically connected to an external device, and the auxiliary terminal electrode is electrically disconnected from the connection terminal electrode;
 an organic EL strip attachment step of attaching each of the organic EL strips to a predetermined location of the first substrate on which the connection terminal electrode and the auxiliary terminal electrode have been formed by patterning, wherein each organic EL strip is spaced apart from an adjacent organic EL strip; and
 an electrode connection step of electrically connecting one of the pair of band-shaped electrodes to the connection terminal electrode by a connector and electrically connecting the other one of the pair of band-shaped electrodes to the auxiliary terminal electrode using the connector on the first substrate to which the organic EL strips have been attached.

12. The method of claim 11, wherein the terminal electrode formation step employs a plating process.

13. The method of claim 11, wherein the terminal electrode formation step employs a printing process.

14. The method of claim 11, wherein the terminal electrode formation step employs a vapor deposition process.

* * * * *